United States Patent [19]

Toudo et al.

[11] Patent Number: 4,522,337
[45] Date of Patent: Jun. 11, 1985

[54] DIGITAL CONTROL CIRCUIT

[75] Inventors: Kenzi Toudo; Motoshi Miyanaka, both of Yanai, Japan

[73] Assignee: Hitachi, Ltd., Tokyo, Japan

[21] Appl. No.: 458,454

[22] Filed: Jan. 17, 1983

[30] Foreign Application Priority Data

Mar. 26, 1982 [JP]  Japan .................................. 57-47198

[51] Int. Cl.³ .......................... F23N 5/20; H03K 5/13
[52] U.S. Cl. .................................. 236/46 F; 307/269; 307/351; 431/69
[58] Field of Search .................. 236/46 F; 431/69, 71, 431/73; 307/351, 269; 361/92

[56] References Cited

U.S. PATENT DOCUMENTS

| 4,145,179 | 3/1979 | Tanaka et al. | 431/29 |
| 4,216,517 | 8/1980 | Takahash | 361/92 X |
| 4,245,150 | 1/1981 | Driscoll et al. | 361/92 X |
| 4,291,357 | 9/1981 | Hong | 361/92 X |

Primary Examiner—William E. Wayner
Attorney, Agent, or Firm—Antonelli, Terry & Wands

[57] ABSTRACT

In a digital control circuit, a clock pulse is counted so that when a predetermined timing is reached the driving of a load is controlled. The digital control circuit may preferably be an integrated circuit for controlling the combustion of a burner for a combustion apparatus such as a water heater or an air heater. The combustion control circuit performs the igniting operation for a predetermined period of time and the supply of fuel is stopped if the ignition can not be attained within the predetermined period. In the digital control circuit, a clock pulse having a predetermined bias voltage is counted by a time measuring circuit and whether the clock pulse has the predetermined bias voltage or not is judged by a detecting circuit so that the igniting operation is stopped when the clock pulse has the predetermined bias voltage, thereby avoiding a risk that, if the input of the clock pulse is interrupted within the predetermined period, the predetermined period may be prolonged indefinitely and the supply of fuel may be continued even though ignition has not been attained.

11 Claims, 7 Drawing Figures

DIGITAL CONTROL CIRCUIT

BACKGROUND OF THE INVENTION

The present invention relates to a digital control circuit in which a clock pulse is counted to measure time and when a predetermined period of time has been reached, control for driving a load is effected, and particularly to a combustion control circuit for controlling combustion of a burner, such as for a water heater, an air heater, etc.

The combustion control circuit of the kind as mentioned above is described in, for example, U.S. Pat. No. 4,145,179 and International Laid-open No. WO 80/01604 (International Application No. PCT/JP80/00008, U.S. patent application Ser. No. 224,289).

The configuration and functions of the combustion control circuit of this kind will be explained first by referring to FIGS. 1 and 2. An integrated circuit 1 for combustion control is provided with a pair of electric supply input terminals 2a and 2b, a clock pulse input terminal 3, a flame detection signal input terminal 4, a temperature detection signal input terminal 5, a blower driving signal output terminal 6, an ignition circuit driving signal output terminal 7, a fuel valve driving signal output terminal 8 and a safety device driving signal output terminal 9. The integrated circuit 1 is composed of a timer 11 for counting clock pulses to measure time, and a control circuit 12 responsive to input signals applied to the input terminals 4 and 5 and input signals from the timer 11 to produce driving signals from the output terminals 6, 7, 8 and 9 at appropriate timings or with a proper sequence.

Reference numeral 13 denotes an a.c. source, 14 denotes a d.c. source circuit, 15 denotes an operation switch, 16 denotes a diode, 17 and 18 denote voltage dividing resistors, and 19 denotes a noise-killing capacitor.

The operation of the thus arranged circuit will be described by referring to FIG. 2. In FIG. 2, the left hand numerals correspond to those used in FIG. 1. When the operation switch 15 is turned on and the input terminal 5 receives at time $t_o$ an input signal which indicates that the temperature of a load has been lowered below a preset value, the control circuit 12 causes the timer 11 to begin to measure time. Clock pulses obtained by half-wave rectifying the a.c. power from the a.c. source 13 are successively applied to the input terminal 3. The timer 11 begins to count the successive clock pulses received by the input terminal 3. That is, a period of prepurging is started and the control circuit 12 produces, at this time, a driving signal from the output terminal 6 to instruct the initiation of the prepurging operation.

When the count of the timer 11 has reached a predetermined value, that is when a preset period of time has been reached, the timer 11 sends a control signal to the control circuit 12 so that the control circuit 12 produces driving signals from the output terminals 7 and 8 to cause an ignition circuit (not shown) and a fuel valve (not shown) to start the igniting operation at time $t_1$. The timer 11 continues its counting operation even if the time $t_1$ has been reached. That is, the timer 11 begins to measure a safety period of time from this time $t_1$. If a flame detection signal indicating the existence of a flame is received at the input terminal 4 at time $t_2$ within the safety period, the control circuit 12 stops the producing driving signal from the output terminal 7 so that the combustion is performed in a normal combustion state. If the flame detection signal disappears, that is if the flame is extinguished, in the normal combustion state, the combustion is restarted from the above-mentioned prepurging operation. Further, if the load temperature exceeds a predetermined value so that the temperature detection signal disappears at the input terminal 5 in the normal combustion state, the control circuit 12 stops the combustion.

In case no flame detection signal arrives at the input terminal 4 during the safety period, the operation is repeated from the beginning of the prepurging operation, or the control circuit 12 stops producing the driving signals from the output terminals 6, 7 and 8 at time $t_4$ and produces, at this time, an alarm signal from the output terminal 9 to stop the combustion operation.

In case any one of the input terminals 8, 4, 9 and 3, for example the input terminal 3, is grounded or a lead wire thereto is broken, intentionally or accidentally, during the safety period, for example at time $t_3$, the safety period will be prolonged infinitly due to the disappearance of a clock pulse, resulting in serious danger because fresh fuel may be released if ignition has not been attained (assuming that the d.c. source is being supplied).

As a countermeasure of this, a second timer may be provided in addition to the timer 11 of the integrated circuit 1 or alternatively a further clock pulse input terminal may be provided in addition to the terminal 3. Each of these cases is, however, expensive.

SUMMARY OF THE INVENTION

An object of the present invention is to eliminate the drawback in the conventional technique, as mentioned above.

Another object of the present invention is to provide an inexpensive digital control circuit.

A further object of the present invention is to provide a digital control circuit comprising a single integrated circuit having a single clock pulse input terminal while at the same time ensuring safety.

According to an aspect of the present invention, a digital control circuit comprises a circuit for generating a clock pulse having a predetermined bias voltage, timer means for measuring time based on the clock pulse and means for detecting the presence of a voltage based on the bias voltage of the clock pulse, so that control is effected to make the load safe when no bias voltage exists.

DESCRIPTION OF THE PREFERRED EMBODIMENTS

Figure 1:
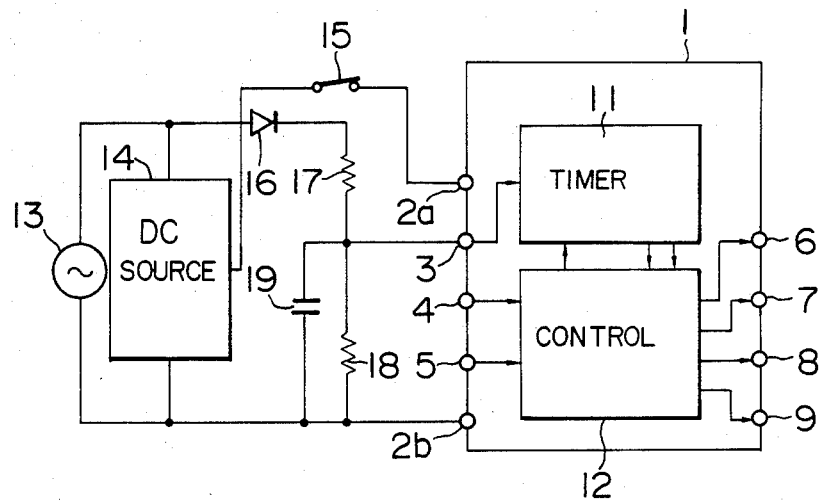
FIG. 1 is a block diagram illustrating a conventional combustion control circuit.
Figure 2:
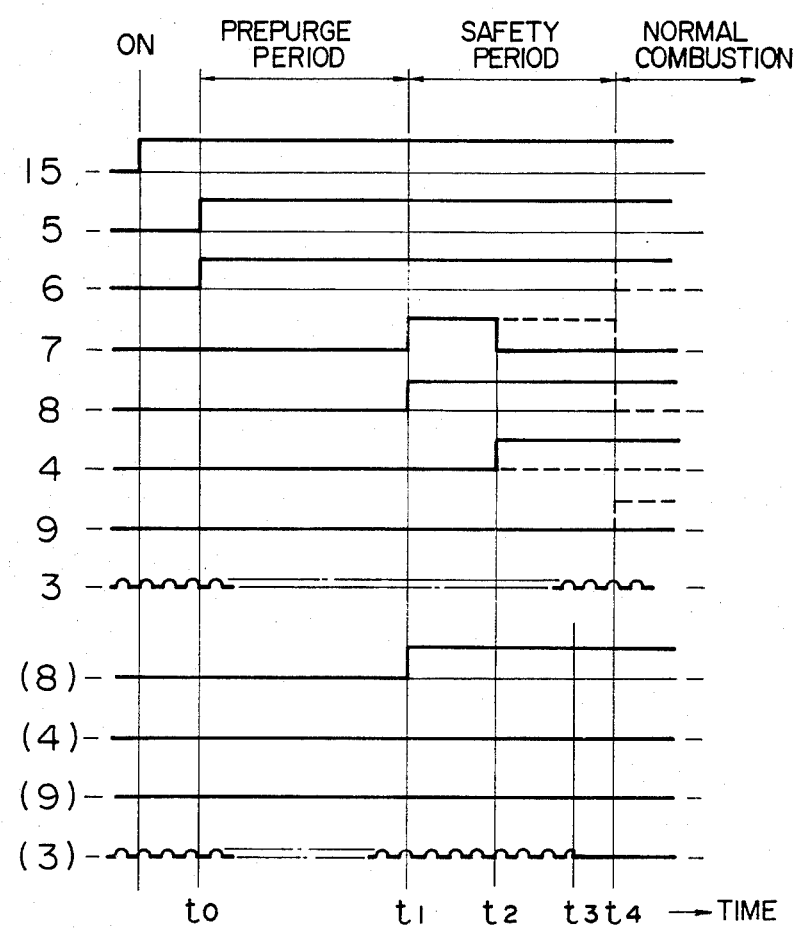
FIG. 2 is a time chart of various waveforms for explaining the operation of the combustion control circuit of FIG. 1.
Figure 3:
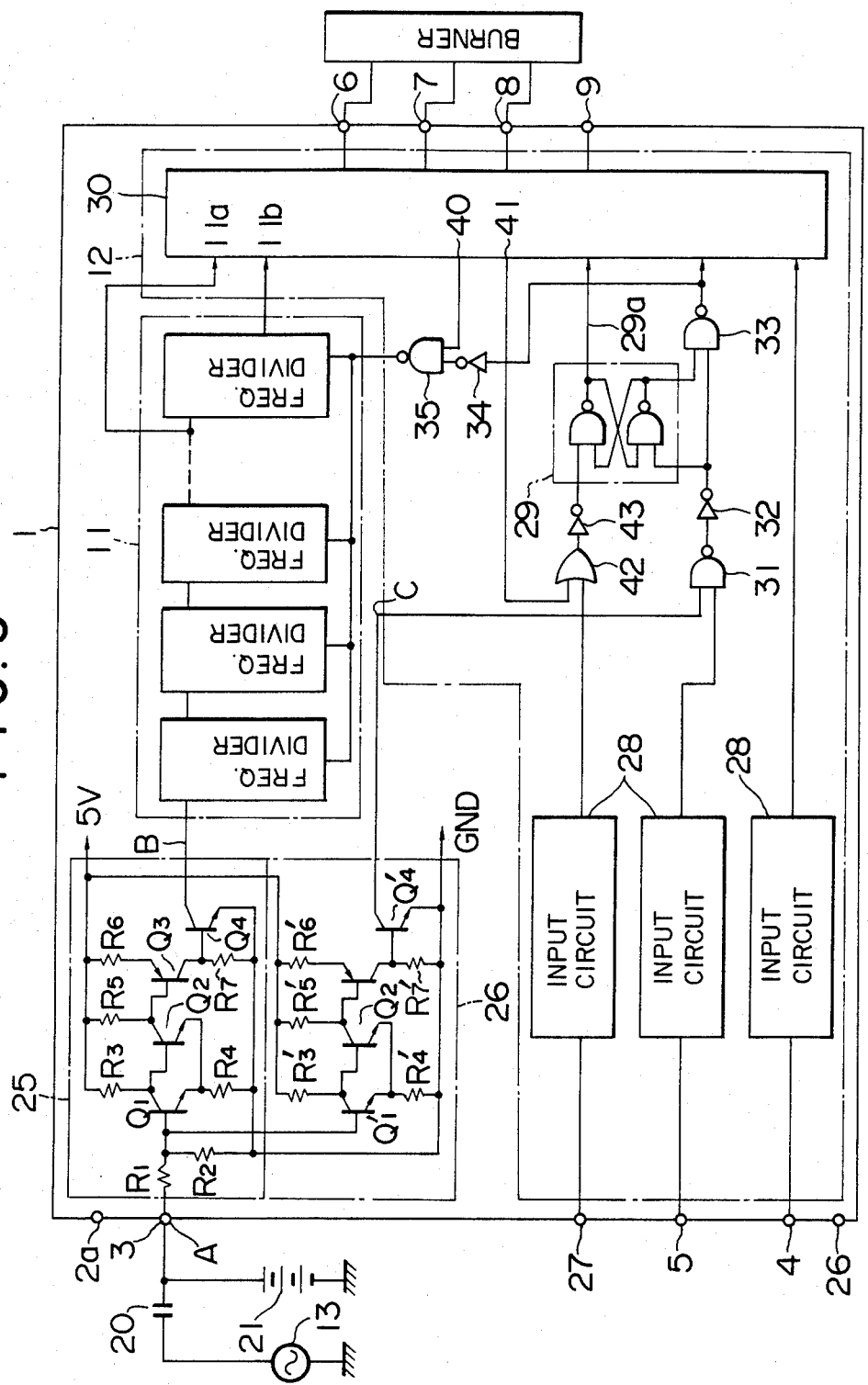
FIG. 3 is a block diagram illustrating the combustion control circuit according to an embodiment of the present invention.
Figure 4:
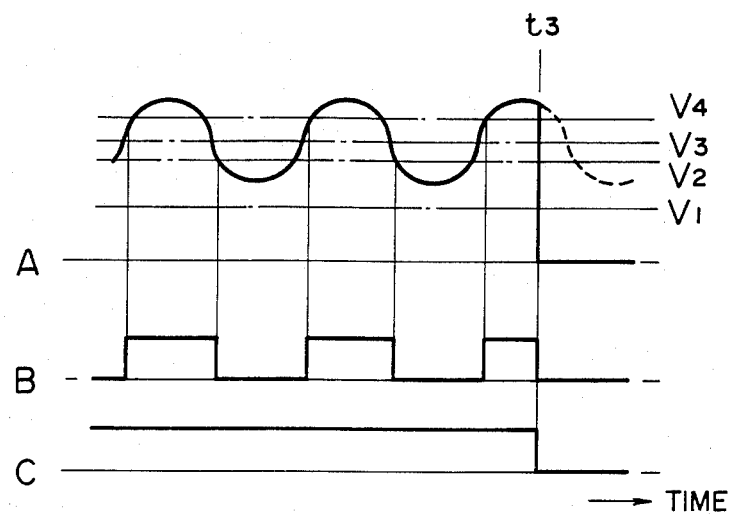
FIG. 4 shows waveforms at various portions in the circuits of FIG. 3.

Referring to FIGS. 3 and 4, the present invention will be explained with respect to an embodiment. In FIG. 3, the same numerals as those used in the conventional circuit shown in FIG. 1 denote the same parts or components as those in the FIG. 1 circuit. FIG. 4 shows waveforms A, B and C appearing at the points A, B and C in the circuit of FIG. 3.

The a.c. source 13, a capacitor 20 and a d.c. power source for providing a bias voltage V3 constitute a clock pulse generating circuit which produces a clock pulse A having the waveform A as shown in FIG. 4.

A waveform forming circuit 25 is composed of a voltage divider constituted by a pair of resistors R1 and R2, a schmidt circuit constituted by transistors Q1, Q2 and resistors R3, R4 and R5, and a driving circuit constituted by transistors Q3, Q4 and resistors R6, R7. The transistor Q4 is turned ON between the values V2 and V4 of the clock pulse A and produces the waveform B of FIG. 4 as an output of the waveform forming circuit 25 to be applied, as a clock pulse, to a timer 11. A detecting circuit 26 for detecting whether the clock pulse A is present or not, is composed, similarly to the waveform forming circuit 25, of a Schmidt circuit constituted by transistors Q1', Q2' and resistors R3', R4' and R5', and a driving circuit constituted by transistors Q3', Q4' and resistors R6', R7'. The detecting circuit 26 is different from the waveform shaping circuit 25 in that the former has no voltage divider. The transistor Q4' is turned ON when the magnitude of the input voltage at the input terminal 3 is lower than the value V1 which is a preselected voltage level. The output of the transistor Q4' has the waveform C as shown in FIG. 4. The value V1 is less in magnitude than the difference between the magnitude of the d.c. bias voltage V3 and the maximum amplitude of the output of the a.c. source 13.

The timer 11 is composed of a plurality of frequency-dividing circuits and produces a prepurge end signal from a terminal 11a and a safety period end signal from a terminal 11b.

An input terminal 27 serves to receive an abnormal detection signal which is made low in case of occurring an abnormal state. An input terminal 4 receives a flame detection signal which is made low when a flame exists. Each of input circuits 28 reverses an input signal applied thereto so as to produce an inverted output signal.

An R-S flip-flop 29 has an output 29a which is made high in the alarming state. In the alarming state, a control circuit 30 produces at each of the output terminals 6, 7 and 8 a stop signal for stopping the operation of each apparatus connected thereto and produces at an output terminal 9 an alarm signal indicating the abnormal state.

The operation of the thus arranged control circuit will be described. First, explanation is made about the case where an operation switch 15 has been turned on, clock pulses are being successively applied, so that the respective parts of the combustion apparatus are properly operating. Hereinafter, the low level will be represented by "L", while the high level by "H".

When the temperature of a load is above a temperature setting, a temperature detection signal input terminal 5 is L and the respective outputs of a NAND gate 31, an inverter 32 and a NAND gate 33 are H, L and H. The R-S flip-flop 29 is reset and the output 29a thereof is made L. Thus, each of the output terminals 6, 7, 8 and 9 produces a stop signal.

When the load temperature becomes lower than the temperature setting, the input terminal 5 becomes H and the respective outputs of the inverter 32 and the NAND gate 33 become H and L, so that the control circuit 30 produces a blower driving signal from the output terminal 6. Further, when the respective outputs of an inverter 34 and an output terminal 40 is H, an output of a NAND gate 35 becomes L, so that the timer 11 starts its function. Thus, the prepurging is initiated.

When an output terminal 11a becomes H, driving signals are produced from the output terminals 7 and 8 so that the fuel is supplied to a combustion apparatus and an igniter operates. Thus, the safety period begins.

Upon the completion of igniting operation, the flame detection signal input terminal 4 becomes L so that the control circuit 30 acknowledges the ignition and stops the operation of the igniter. Further, an output terminal 40 of the control circuit 30 becomes L so as to make the output of the NAND gate 35 H to thereby stop the operation of the timer 11.

In the case the igniting operation can not be completed within the safety period, an output terminal 11b becomes H at the end of the safety period, so that the control circuit 30 produces stop signals from the respective output terminals 6, 7 and 8. Further, the control circuit 30 produces an H output at its output 41 so that the output of an OR gate 42 becomes H, the output of an inverter 43 becomes L, the R-S flip-flop 29 is set so as to make its output terminal 29a H, so that the stop signals at the respective output terminals 6, 7 and 8 are maintained as they were and an alarm signal is produced from the output terminal 9.

This applies as well to the case where the input terminal 27 becomes L for the same reasons indicated above.

If the input of the clock pulses is nullified by grounding within the safety period, the input voltage at the input terminal 3 becomes below the value V1 as shown in FIG. 4 so that the transistor Q4' of the detecting circuit 26 is turned on, thereby making the output of the NAND gate 31 H. Similarly to the case of higher load temperature, the respective stop signals are provided at the output terminals 6, 7 and 8 so as to stop the operation of the combustion apparatus.

Accordingly, even in the case where the application of the clock pulse signal is interrupted under the condition of non-ignition within the safety period, the operation of the combustion apparatus can be stopped and any possible danger can be prevented from occurring.

Further, in the case where the lead wire is broken at the left side from the connection point of the d.c. source 21, the operation of the combustion apparatus cannot be stopped by means of the detecting circuit 26, while in the case where the lead wire is broken at the right side, it can be stopped by the detecting circuit 26.

Figure 5:
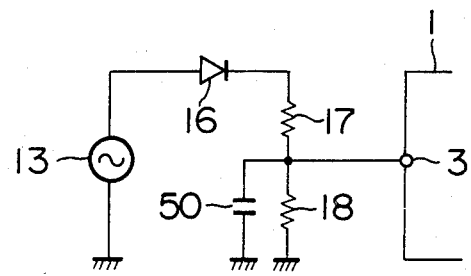
FIG. 5 is a circuit diagram of another embodiment of the present invention.

FIG. 5 shows an embodiment in which a bias voltage is applied by a capacitor 50. The capacitor 50 is charged by the clock pulses and produces the output voltage V1. By this arrangement, the operation of the combustion apparatus can be stopped in the case of the broken lead-wire.

If the source 13 is turned on under the condition that the operation switch 15 has been turned on and if the charged voltage across the capacitor 50 is below the value V1, the transistor Q4' of the detecting circuit 26 is in the on-state. There is no problem in this, although the initiation of the prepurging operation is slightly delayed. In the combustion apparatus in which no prepurging operation is effected, there occurs no problem, although the initiation of the igniting operation is somewhat delayed.

Thus, when the output of the detecting circuit 26 indicates an abnormal state, it is preferable to arrange the circuit to be equivalent to the state in which a signal requesting no combustion is applied to the temperature detecting signal input terminal 5. That is, it is preferable to arrange the circuit such that the R-S flip-flop 29 does not operate in that case.

Figure 6:
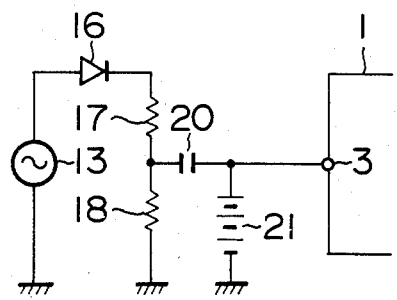
FIG. 6 is a circuit diagram of a further embodiment of the present invention.

FIG. 6 shows an embodiment in which a clock pulse halfwave-rectified by a diode 16 is produced when a bias voltage is applied by a d.c. source 21.

Figure 7:
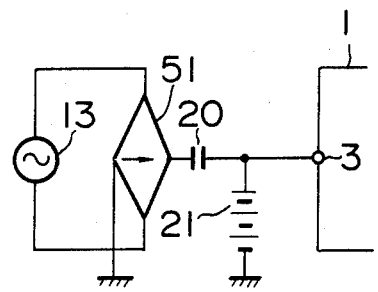
FIG. 7 is a circuit diagram of a still further embodiment of the present invention.

FIG. 7 shows an embodiment in which a clock pulse is produced through full-wave rectification by a diode-bridge 51.

The timer 11 used in the previously described embodiment and constituted by frequency-divider circuits can be similarly employed also in the case where the integrated circuit 1 is constituted by a microcomputer.

Further, the description has been made with respect to the embodiments in which the present invention is realized as a combustion control circuit, however it is apparent that the embodiments can be applied to control devices other than those used for combustion control.

Although it is preferable to contain the timer 11, the control circuit 12 and the detecting circuit 26 in a single package, the object of the present invention can be substantially attained without this feature although the effect is lowered correspondingly.

According to the present invention, as described above, the non-safety state can be avoided with very simplified configuration in case of interruption of the input of the clock pulse.

We claim:

1. A digital control circuit comprising first circuit means for producing a clock pulse signal including first means for producing a pulse signal and second means for applying a predetermined bias voltage to said pulse signal to produce an output clock pulse signal; time-measuring means responsive to the output clock pulse signal of said first circuit means for counting the pulses of said clock pulse signal to measure time; control means responsive to said time-measuring means and at least one control signal for producing a first digital signal for controlling a load, said control means including means for changing the state of said first digital signal in response to an output signal produced by said time-measuring means when a preset timing is reached subsequent to receipt of said control signal for effecting operation of said load; second circuit means connected to said first circuit means for judging whether the output clock pulse signal of said second means has a predetermined voltage level corresponding to said predetermined bias voltage and for producing a second signal when said output clock pulse signal of said second means differs from said predetermined voltage level; and means responsive to said second signal for controlling said control means to control the state of said first digital signal to prevent operation of said load.

2. A digital control circuit according to claim 1, in which said time-measuring means, said control means, and said second circuit means are formed in a single integrated circuit.

3. A digital control circuit according to claim 1, in which said second means comprises a capacitor connected between said first means and the input of said time-measuring means, and a d.c. source provided between said input of said time-measuring means and ground.

4. A digital control circuit according to claim 1, wherein said first means is connected to the input of said time-measuring means via a rectfier and in which said second means comprises a capacitor connected between said input of said time-measuring means and ground, so that said capacitor is charged by the output of said first means to said predetermined bias voltage.

5. A digital control circuit according to claim 1, in which said control means comprises a combustion control means for controlling a burner.

6. A digital control circuit comprising means for providing a clock pulse signal of predetermined magnitude; control means responsive to said clock pulse signal and at least one control signal for generating a first signal for controlling a load; detection means connected to the output of said clock pulse signal providing means for detecting the magnitude of the pulses of said clock pulse signal and for generating a second signal when said magnitude falls below a preselected voltage level; and means connected to said detection means for preventing generation of said first signal by said control means in response to receipt of said second signal; said clock pulse signal providing means comprising an a.c. source connected to a source of d.c. bias voltage, said preselected voltage level being less in magnitude than the difference between the magnitude of said d.c. bias voltage and the maximum amplitude of the output of said a.c. source.

7. A digital control circuit comprising means for providing a clock pulse signal of predetermined magnitude; control means responsive to said clock pulse signal and at least one control signal for generating a first signal for controlling a load; detection means connected to the output of said clock pulse signal providing means for detecting the magnitude of the pulses of said clock pulse signal and for generating a second signal when said magnitude falls below a preselected voltage level; and means connected to said detection means for preventing generation of said first signal by said control means in response to receipt of said second signal; said clock pulse signal providing means comprising an a.c. source connected in series with a capacitor across a source of d.c. bias voltage, the point of connection of said capacitor to said source of d.c. bias voltage being connected to said detection means.

8. A digital control circuit according to claim 7, wherein said clock pulse signal providing means further comprises a Schmidt circuit connected between the point of connection of said capacitor and said source of d.c. bias voltage and the input of said control means.

9. A digital control circuit comprising means for providing a clock pulse signal of predetermined magnitude; control means responsive to said clock pulse signal and at least one control signal for generating a first signal for controlling a load; detection means connected to the output of said clock pulse signal providing means for detecting the magnitude of the pulses of said clock pulse signal and for generating a second signal when said magnitude falls below a preselected voltage level; and means connected to said detection means for preventing generation of said first signal by said control means in response to receipt of said second signal; said clock pulse signal providing means comprising an a.c. source connected in series with a rectifier across a source of d.c. bias voltage, the point of connection of said rectifier to said source of d.c. bias voltage being connected to said detection means.

10. A digital control circuit according to claim 9, wherein said clock pulse signal providing means further comprises a Schmidt circuit connected between the point of connection of said rectifier and said source of d.c. bias voltage and the input of said control means.

11. A digital control circuit comprising means for providing a clock pulse signal of predetermined magnitude; control means responsive to said clock pulse signal and at least one control signal for generating a first signal for controlling a load; detection means connected to the output of said clock pulse signal providing means for detecting the magnitude of the pulses of said clock pulse signal and for generating a second signal when said magnitude falls below a preselected voltage level; and means connected to said detection means for preventing generation of said first signal by said control means in response to receipt of said second signal; said control means comprising combustion control means for a burner.

* * * * *